(12) United States Patent　　(10) Patent No.: US 8,060,671 B2
Southerland et al.　　(45) Date of Patent: *Nov. 15, 2011

(54) PORTABLE MEDIA ENCODER

(75) Inventors: Rick Southerland, Plano, TX (US); Mark Fears, Plano, TX (US); Mark Hershey, Murphy, TX (US); Chris McCauley, Dallas, TX (US)

(73) Assignee: ViewCast.com, Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/826,309

(22) Filed: Jun. 29, 2010

(65) Prior Publication Data

US 2010/0328534 A1　　Dec. 30, 2010

Related U.S. Application Data

(63) Continuation of application No. 11/391,014, filed on Mar. 28, 2006, now Pat. No. 7,747,798.

(60) Provisional application No. 60/782,497, filed on Mar. 15, 2006, provisional application No. 60/764,140, filed on Jan. 31, 2006.

(51) Int. Cl.
*G06F 13/12* (2006.01)
*H04N 7/18* (2006.01)

(52) U.S. Cl. ............................................. 710/62; 725/81

(58) Field of Classification Search .................... 710/62; 725/81

See application file for complete search history.

(56) References Cited

U.S. PATENT DOCUMENTS

| | | | |
|---|---|---|---|
| 5,105,183 A | 4/1992 | Beckman | |
| 6,336,149 B1 * | 1/2002 | Preston | 710/1 |
| 6,360,900 B1 | 3/2002 | Carbonneau et al. | |
| 6,404,818 B1 | 6/2002 | Obikane | |
| 6,741,463 B1 | 5/2004 | Akhtar et al. | |
| 7,116,894 B1 | 10/2006 | Chatterton | |
| 2002/0146080 A1 | 10/2002 | Dress et al. | |
| 2003/0036357 A1 | 2/2003 | McGowan | |
| 2004/0183834 A1 * | 9/2004 | Chermesino | 345/773 |
| 2005/0054375 A1 | 3/2005 | Patel et al. | |
| 2005/0055472 A1 | 3/2005 | Krzyzanowski et al. | |
| 2005/0108519 A1 | 5/2005 | Barton et al. | |

(Continued)

OTHER PUBLICATIONS

Tjosvold, Forum on DragonSoftware, Apr. 5, 2005, VoiceRecognition.com.*

(Continued)

*Primary Examiner* — Henry Tsai
*Assistant Examiner* — Hyun Nam
(74) *Attorney, Agent, or Firm* — Howison & Arnott, L.L.P.

(57) ABSTRACT

A portable media encoder is disclosed. The portable media encoder comprises a video input port configured to receive a video input from a video source, an audio input port configured to receive an audio input from an audio source, and a digital output port for providing a digitized output stream corresponding to the received video input and audio input. The encoder has an encoding processor that converts the video input and the audio input into a streamable digital output format for transmitting through the digital output port, a set of control buttons communicatively coupled to the encoding processor and operable to provide encoding parameters to thereto, and a housing enclosing the encoding processor and providing at least one access panel providing user access to the video input port, the audio input port, the digital output port, and the set of control buttons. The housing having a size and configuration that allows the encoder to be hand carried by a single individual.

20 Claims, 10 Drawing Sheets

U.S. PATENT DOCUMENTS

| | | |
|---|---|---|
| 2005/0141885 A1 | 6/2005 | Roman et al. |
| 2005/0238023 A1 | 10/2005 | Robertson et al. |
| 2005/0253969 A1* | 11/2005 | Sullivan .................. 348/565 |
| 2005/0265004 A1 | 12/2005 | Coglitore et al. |
| 2005/0273825 A1 | 12/2005 | Eldeeb |
| 2005/0276270 A1 | 12/2005 | Buinevicius et al. |
| 2005/0276568 A1 | 12/2005 | Korkis |
| 2006/0070107 A1* | 3/2006 | Renkis .................. 725/105 |
| 2006/0080094 A1 | 4/2006 | Katayama et al. |
| 2006/0239244 A1 | 10/2006 | Hurst et al. |
| 2007/0053379 A1 | 3/2007 | Hershey et al. |
| 2007/0055787 A1 | 3/2007 | Hershey et al. |
| 2007/0189411 A1 | 8/2007 | Goss |

OTHER PUBLICATIONS

PCT: International Search Report and Written Opinion of PCT/US2007/061376; Mar. 5, 2008; 8 pgs.

Select the Right Agilent Signal Analyzer for Your Needs, Apr. 4, 2003, Agilent Technologies; 12 pgs.

Watkins-Johnson Company, FSK: Signals and Demodulation, vol. 7, No. 5, Sep./Oct. 1980; 13 pgs.

\* cited by examiner

PORTABLE MEDIA ENCODER

CROSS-REFERENCE TO RELATED APPLICATIONS

This application is a continuation of U.S. patent application Ser. No. 11/391,014, filed Mar. 28, 2006, and entitled PORTABLE MEDIA ENCODER, published as U.S. Patent Application Publication No. US 2007/0192814, now U.S. Pat. No. 7,747,798, issued Jun. 29, 2010. U.S. patent application Ser. No. 11/391,014 claims benefit of U.S. Provisional Application Ser. No. 60/764,140, filed Jan. 31, 2006, and U.S. Provisional Application Ser. No. 60/782,497, filed Mar. 15, 2006. U.S. Patent Application Publication No. US 2007/0192814 and U.S. Pat. No. 7,747,798 are incorporated by reference herein.

TECHNICAL FIELD

The present invention relates to streaming media, and more particularly to a portable device for providing streaming media over the Internet or a private network.

BACKGROUND

As the use of the Internet has become ubiquitous, more services are being offered online. This includes not only interactive services for which the Internet is widely known, such as email, online shopping, online banking, and customized information services, but has also come to include services that have traditionally been non-interactive, such as the provision of radio programming and television programming. Streaming media, in primitive forms, has been present on the Internet for some time. However, as greater numbers of users gain access to high speed data lines through school, through work, or through a home based broadband solution, more people will come to see the Internet in general, and streaming media in particular, as a viable alternative for the delivery of media content. This includes daily programming such as typically appears on network broadcasting stations as well as special event programming such as movies and sporting events.

Streaming media delivery is both promising and problematic. With traditional media delivery vehicles such as broadcasting and cable or satellite feeds, users typically must plan to be available when the broadcast is available or make other arrangements on their own. However with streaming media and Internet content, users expect delivery to be at their discretion. This can raise a variety of issues for providers as they attempt to deal with what is essentially replicating the broadcast event for every viewer. In addition to current and ongoing programming, providers are faced with the problem of legacy programming that may prove valuable if it can be provided more or less on-demand when viewers so request. The vast amount of programming currently available, as well as the large volume of non-digital legacy programming, can create problems associated with the scale or size of a given operation as well as with the technical difficulties involved in the delivery.

In addition to digitally encoding legacy programming, economies may be gained by providing a real-time digital stream corresponding to a filmed or taped event as the event is occurring. In this way, an event need not be filmed or recorded in a traditional manner and then converted to an appropriate digital format. Live coverage of an event could be provided directly in a streaming digital format. The event would be "broadcast" over a packet-based network. For some events, it may be possible to skip the traditional filming entirely and simply provide coverage in a digital streaming format. Of course, the digital stream could also be archived for later viewing or retrieval. The digital streaming broadcast model may also appeal to those without sufficient capital to invest in traditional recording or broadcasting equipment. Home videos, for example, could be captured and streamed directly over the Internet.

Therefore what is needed is a system and method for dealing with the issues discussed above and related issues.

SUMMARY

The present invention disclosed and claimed herein, in one aspect thereof, comprises a portable media encoder. The portable media encoder has a video input port configured to receive a video input from a video source, an audio input port configured to receive an audio input from an audio source, and a digital output port for providing a digitized output stream corresponding to the received video input and audio input. The encoder has an encoding processor that converts the video input and the audio input into a streamable digital output format for transmitting through the digital output port, a set of control buttons communicatively coupled to the encoding processor and operable to provide encoding parameters to thereto, and a housing enclosing the encoding processor and providing at least one access panel providing user access to the video input port, the audio input port, the digital output port, and the set of control buttons, the housing having a size and configuration that allows the encoder to be hand carried by a single individual.

The present invention disclosed and claimed herein, in another aspect thereof, comprises a portable media encoder system. The system includes a rack mount for receiving a plurality of portable media encoders each having a docking connector, a plurality of audiovisual input ports, and at least one digital output port, the portable media encoders being operable to receive an input signal and covert the input signal into a digitized streamable output. The system also includes a set of audiovisual input ports and at least one digital output port replicating the set of audiovisual input ports and the digital output ports, respectively, of each the plurality of portable media encoders. A plurality of docking connectors for selectively communicatively coupling with the docking connector of each of the plurality of portable media encoders is provided. The rack mount provides input signals received on the replicated audiovisual input ports to the respective portable media encoder via its docking connector and provides output received from the portable media encoder via its docking connector to the respective replicated digital output port.

The present invention disclosed and claimed herein, in another aspect thereof, comprises a portable media encoder. The portable media encoder has a rigid housing providing a front control panel, a rear access panel, and at least one carry handle. A set of audiovisual input ports and at least one digital output port is on the rear access panel and a set of preprogrammed buttons is on the front control panel. A main logic board is securely affixed within the housing and communicatively coupled to the preprogrammed startup buttons and the digital output port. A capture card is communicatively coupled to the main logic board and the audiovisual input ports. The capture card digitizes input received from the audiovisual input ports and provides a corresponding digitized output to the main logic board. The main logic board receives a user command via the set of preprogrammed buttons, encodes the digitized output corresponding to operational parameters associated with the user command to produce a streamable digital output, and provides the streamable digital output to the digital output port.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Figure 1:
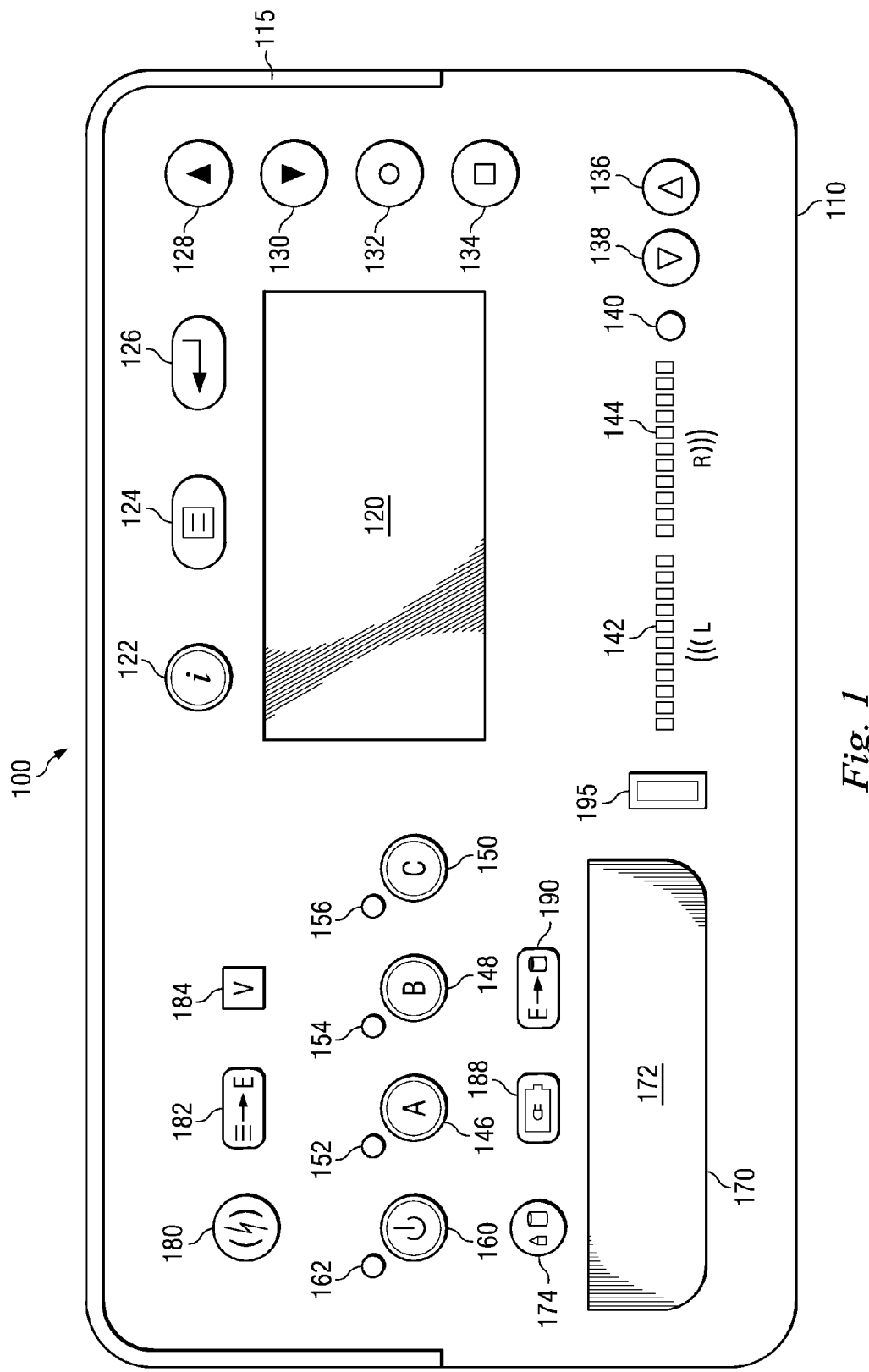
FIG. 1 a frontal view of a portable media encoder according the aspects of the present disclosure.

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Referring now to FIG. 1, a frontal view of a portable media encoder 100 according to aspects of the present disclosure is shown. The overall purpose of the portable media encoder 100, in one embodiment, is to receive an audiovisual input signal and provide the input as a digital streaming output. In other embodiments, the portable media encoder 100 may be able to provide simultaneous digitized output streams corresponding to the same event. The controls illustrated in FIG. 1 on the front of the encoder may be used to control the encoder and provide configuration information. Inputs and outputs are generally provided on the rear of the encoder 100 and will be described in greater detail below. FIG. 1, in particular, illustrates various controls and features associated with a front panel 110 of the portable media encoder 100. A collapsible handle 115 may be provided on the front panel 110 and may serve as a means of carrying the portable media encoder 100, or for inserting or removing the portable media encoder 100 into a rack mount as described below. A display screen 120 provides operational information and cues to a user of the portable media encoder 100. Audio level meters 142, 144 may be provided to indicate the amplitude of the audio portion of the encoded output stream. An additional means of monitoring the encoded audio output may be provided by the head phone jack 140. In some embodiments, the portable media encoder 100 also has a media port 170. The media port 170 may be used to interface with an external storage device, such as a hard disk drive (HDD) or flash memory based device, which may be used to store or archive an encoded output data stream. A universal serial bus (USB) port 195 may also be available for connecting to an external storage device or for connecting additional input/output devices to the portable media encoder 100.

The collapsible handle 115 may be made from a metal, an alloy, a plastic, or other material. The collapsible handle 115 may be configured so as to be static discharge resistant in order to protect the portable media encoder 100 from static discharges. In some embodiments the collapsible handle 115 may be coated with a rubber or plastic to improve grip and/or provide additional insulation. The collapsible handle 115 may be adapted to close or collapse flush with the front panel 110 of the portable media encoder 100 when not in use. The collapsible handle 115 may be mounted to the portable media encoder 100 on internal hinges or slides providing means for collapsing the handle 115.

The display screen 120 may be an LED display such as a four line by twenty character textual display, a black and white or color liquid crystal display (LCD) screen, with or without a back light, or another type of display screen suitable for use with the portable media encoder 100. The size of the display screen 120 may be chosen to fit the needs of the user. In the present embodiment, the display screen 120 is sized proportionately to fit the front panel 110 such that the display screen 120 is viewable on the front panel 110 without hinges, swivels, or other adjustments. In some embodiments, the display screen may be capable of displaying graphics and other high resolution information. The display screen 120 may be contact sensitive such that user selections may be input directly into the display screen 120. In operation the display screen 120 may provide a textual indication of nominal behavior of the portable media encoder 100. The display screen 120 may also provide alarm information content in the event of an alarm being generated by the portable media encoder 100. The display screen 120 can be also used to provide operational cues to a user who may be configuring the portable media encoder 100 through one of the menu systems described below. In some embodiments, the display screen 120 may be used to display communications from a remotely-located director or operator to the local user of the portable media encoder 100.

The buttons and controls provided on the front panel 110 of the portable media encoder 100 may be electro-mechanical push buttons or may be pressure-sensitive solid-state buttons. In some embodiments, the buttons will be sealed for protection against dirt or other debris encountered in various operating environments of the portable media encoder 100. Some of these buttons may perform a specific, predetermined operation in every situation in which they are used, while others buttons may be context sensitive. One example of a context sensitive button is the information button 122. The information button 122 may be clearly marked with an easily identifiable symbol such as 'i', as shown in FIG. 1. In the embodiment shown, the 'i' corresponds to "information." Pressing the information button 122 provides context specific critical information on the display screen 120. Other buttons such as the 'A' button 146, may typically provide the same operation or sequence of operations each time they are pressed. Operation of the information button 122 and the 'A' button 146 are described in greater detail below.

The menu button 124 provides user access to a series of menus and interactive services provided by the portable media encoder 100. The entry button 126 and up and down selection buttons 128, 130, respectively, are provided to aid in user interaction with the portable media encoder 100. The record or encode button 132, as well as the stop button 134, may also be used in the context of the menu system provided with the portable media encoder 100. The encode button 132 and the stop button 134 are used generally to start and stop the encoding process. A volume up button or key 136 as well as a volume down button 138 are provided for the convenience of a user monitoring the encoded audio stream via the headphone jack 140. The headphone jack 140 may be a standard 2.5 mm stereo jack or a jack of another type or size depending upon the needs of the user and the configuration of the portable media encoder 100. Corresponding to the left and right audio channels produced by the portable media encoder 100 are audio level meters 142, 144, respectively. The audio level meters 142 and 144 may be a series of light emitting diodes (LED's) designed to illuminate incrementally according to the amplitude of the encoded audio signal. In some embodiments the LED's may be different colors. For example, green LED's may be used for low amplitude signals while red LED's may be used for high amplitude signals.

One or more preprogrammed buttons such as an 'A' button 146, a 'B' button 148, and a 'C' button 150 may be provided to allow the portable media encoder 100 to be started with a reduced amount of configuration information provided by the user. In one embodiment, the user may be able to connect the portable media encoder 100 to proper input and output sources and begin an encoding session by pressing the 'A' button 146. The 'A' button 146 may be tied to specific encoding configuration information stored within the portable media encoder 100. Such configuration information may include, but is not limited to, source type, output type, frame rate, resolution, and other parameters. Similarly, the 'B' button 148 and the 'C' button 150 may be associated with a different set of parameters that may be commonly used with the portable encoder 100. Indicator lights 152, 154, and 156 associated with the 'A' button 146, the 'B' button 148, and the 'C' button 150, respectively, may be set to illuminate when the portable media encoder 100 is operating under one of the preprogrammed modes accessed via the preprogrammed buttons 146, 148, 150. The indicator lights 152, 154, and 156, as well as the other indicator lights described herein, may be light emitting diodes (LEDs), incandescent bulbs, or other electro-luminescent devices adequately visible to the user.

A main power button 160 may be provided as well as a power indicator 162. An alarm indicator 180 may illuminate when the encoder 100 is in an alarm state. Information corresponding to alarm states may also be provided on the display screen 120, as will be described in greater detail below. In some embodiments, the portable media encoder 100 may be remotely controllable, for example, via a network. When the portable media encoder 100 is being remotely controlled, a network control indicator 182 may be illuminated. Other indicators may reflect the current operational status of the portable media encoder may be provided, such as video signal indicator 184. The video signal indicator 184 may illuminate when a video signal is detected as being input to the portable media encoder 100. Indicator lights may also be associated with the media port 170, such as the docking light 188 and the transfer indicator 190. The docking light 188 illuminates when a portable storage device is inserted into the media port 170 and has become recognized by the portable media encoder 100. The portable media encoder 100 may provide the capability of streaming or archiving encoded streams to a portable storage device attached to the media port 170. The portable media encoder 100 provides an indication that this is occurring via illumination of the transfer indicator 190.

The portable media encoder 100 is capable of receiving signals from a plurality of different source types and converting the various source types into a plurality of different encoded media formats. The various format types which may be encoded by the portable media encoder 100 include, but are not limited to, Windows Media® format from Microsoft Corporation of Redmond, Wash., Real Media® format from Real Networks, Inc., of Seattle, Wash., Flash Video® format from Macromedia, Inc., of San Francisco, Calif., Quick-Time® format by Apple Computer, Inc., of Cupertino, Calif., and various standards from the Motion Pictures Expert Group (MPEG). In some modes of operation, the portable media encoder 100 provides real-time streaming of the encoded files over an Internet connection. In addition to the preprogrammed buttons 146, 148, 150, the portable media encoder 100 may also be configured manually via the menu buttons 124, 126, 128, 130, or may be configured remotely via a network interface.

The full functionality of the media port 170 will be described in greater detail below. However, it may be appreciated from FIG. 1 that a portable media device may be insertable directly into the front panel 110 of the portable media encoder 100. A door 172 may be provided to prevent contamination of the interior connectors and other components of the portable media encoder 100 when a portable storage device is not present. Portable storage devices suitable for use with the portable media encoder 100 may be automatically recognized by the portable media encoder 100. The docking indicator 188 illuminates when the portable storage device has been recognized and is ready for use. Because the portable storage device may be mounted within the operating system of the portable media encoder 100 as a disk drive, an unmount button 174 is provided. When pressed, the portable media encoder 100 will typically dismount the attached portable storage device to allow removal of the storage device without data loss.

In some embodiments, configuration information may be provided via the USB port 195 or via the removable media port 170. The USB port 195 may accept a media storage device such as a USB flash drive or USB-enabled hard disk drive. Configuration information may be stored on the USB device and automatically loaded into the portable media encoder 100. In some embodiments, new or altered menu systems may be provided by a USB device attached to the USB port 195. Upgrades to the configuration, the operating system, or programming of the media encoder 100 itself may also be provided via a USB device. The information provided by a USB device may either be retained in the encoder 100 or may be available only when the USB device is connected to the portable media encoder 100. In a similar manner as the USB port 195, the media port 170 may accept a media device storage device capable of providing configuration or upgrade information to the portable media encoder 100.

Figure 2:
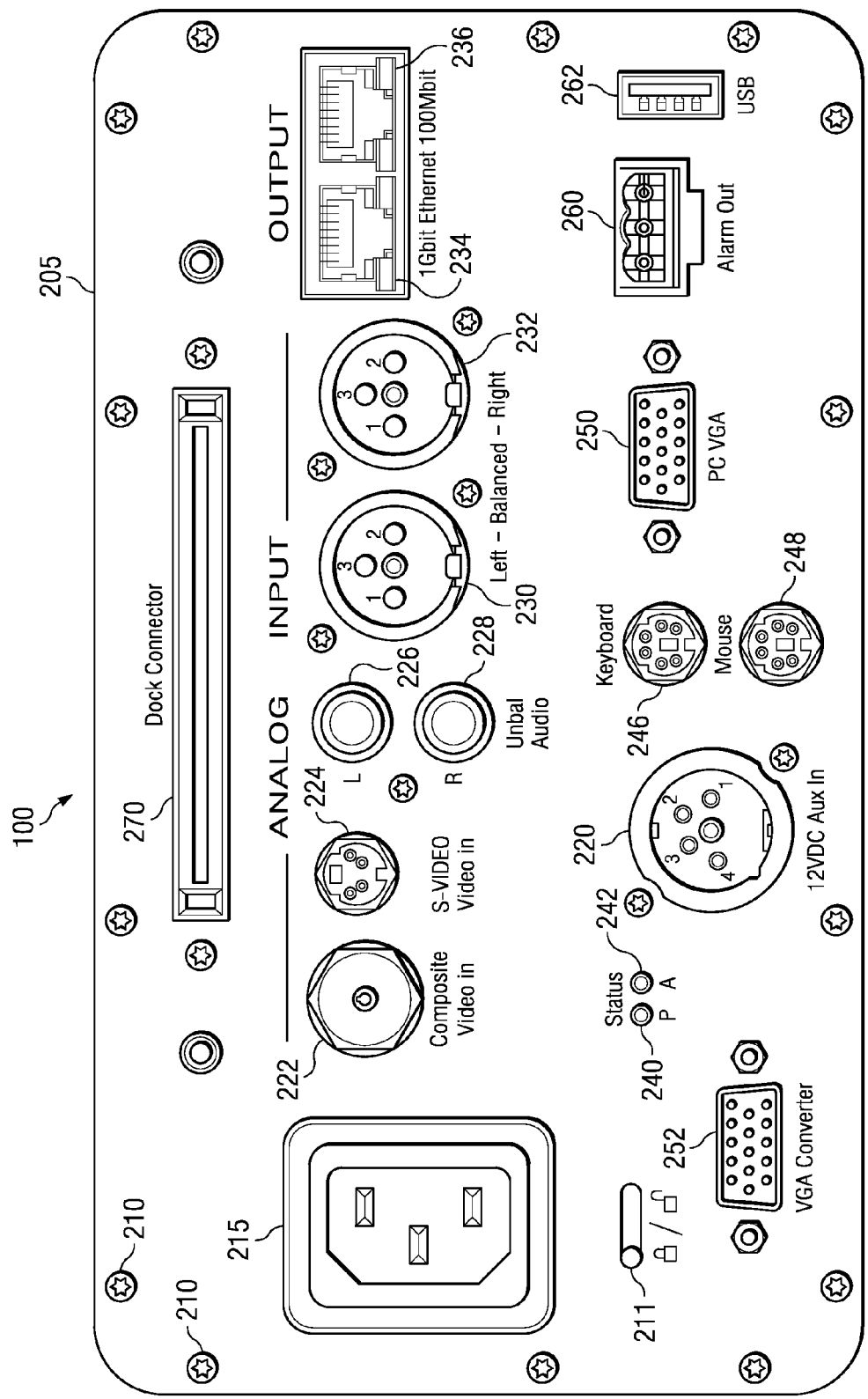
FIG. 2 is a back view of a rear panel of the portable media encoder of FIG. 1.

Referring now to FIG. 2, a back view of a rear panel 205 of the portable media encoder 100 of FIG. 1 is shown. It can be seen from FIG. 2 that the rear panel 205 may be attached to the portable media encoder 100 via screws 210 or other fastening means. A lockout switch 211 may be provided on the rear panel 205 of the portable media encoder 100. The lockout switch 211, when in a locked position, may function to prevent any changes or alterations to the operating state of the portable media encoder 100 via the controls on the front panel 110. Thus, when the portable media encoder 100 has been properly setup and started, the lockout switch 211 may be placed in the locked position to prevent inadvertent or purposeful tampering with the portable media encoder 100. The lockout switch 211 may be placed in the unlocked position to allow user interaction with the portable media encoder 100.

The rear panel 205 provides a plurality of input and output connections for the portable media encoder 100. The portable media encoder 100 may be powered through the rear panel 205 using an alternating current (AC) power connection 215 or a direct current (DC) power connection 220. The AC power connection 215 may be adapted to accept a standard power cord connectable to a standard 120 volt (V) wall outlet. A 12 V auxiliary source may also be used to power the portable media encoder 100 by connecting to the DC power connector 220. Either the AC power connector 215 or the DC power connector 220 may be adapted to interfit with any type of power cord that is provided and the present disclosure is not meant to be limited to the specific embodiments shown. A power indicator light 240, which may be a red LED, may also be provided to provide a visual indication that the portable media encoder 100 is powered. A drive activity indicator 242, which may be a yellow LED, may also be provided proximate the power indicator 240. The drive activity indicator 242 may illuminate when an internal storage device for the portable media encoder 100 is active.

In the present embodiment, the inputs into the portable media encoder 100 will be analog inputs. These inputs may include both video and audio. A composite video input 222 and an S-video input 224 may be provided. Unbalanced audio inputs may be accepted by the left unbalanced audio input 226 and the right unbalanced audio input 228. The unbalanced audio inputs of FIG. 2 are RCA-style connectors but other types of connectors may be used in other embodiments. Balanced audio input may be accepted on the left balanced audio input connector 230 and the right balanced audio connector 232. In the embodiment shown, the balanced audio connectors are external live return (XLR) type connectors but in other embodiments other connections may be used. Other types of audio and/or video connectors may be provided on the rear panel 205 such as the VGA input 252.

The output from the portable media encoder 100 may be provided on one or more ethernet connections 234, 236. In other embodiments, other digital outputs may be used, such as a wireless digital output. In the embodiment shown, ethernet connection 234 is a 1 gigabit (Gb) connection while ethernet connection 236 is a 100 megabit (Mb) connection. Other embodiments may provide different speeds of ethernet connections and the present disclosure is not meant to be limited to the examples shown. It is also not necessary that ethernet ports be provided as outputs at all. As stated, output from the portable media encoder 100 may also be provided via a media port 170 on the front panel 110 of the portable media encoder 100. Similar in function to the front USB port 195, a second USB port 262 on the rear panel 205 may be used to provide output from the portable media encoder 100. The USB port 262 may also be used as an input device to the portable media encoder 100. A USB storage device may be attached USB port 262 to provide updated programming or control instructions to the portable media encoder 100. Input/output devices such as a keyboard or mouse may be connected to the portable media encoder 100 via the USB ports 195, 262. However, a separate keyboard port 246 and mouse port 248 may be provided. The keyboard port 246 and mouse port 248 are PS/2 type connectors in the embodiment shown, although other types of connectors may be used. In some embodiments a VGA output 250 may also be used to attach a separate view screen to aid in configuring, operating, or updating the portable media encoder 100. An alarm output 260 may also be provided on the rear panel 205 to provide an indication of an alarm condition occurring within the portable media encoder 100. The alarm output 260 may provide an electrical signal indicating an alarm to a remote location independent of the other output means such as ethernet connections 234, 236.

A dock connector 270 may also be provided on the rear panel 205 of the portable media encoder 100. The dock connector 270 functions as a data and communications bus to the internal components of the portable media encoder 100. The dock connector 270 may be used to provide control information, programming data, and control inputs to the portable media encoder 100. The dock connector 270 may also be used to provide input signals to, and receive output signals from, the portable media encoder 100. In this manner, the dock connector 270 could be used to expand the existing range of input and output options for the portable media encoder 100. The dock connector 270 may be used to replicate all of the discrete connectors on back panel 205 through a single integrated connection as to allow connection of the encoder 100 into a docking station or a rack mount with out requiring the connection of numerous discrete cables. The docking connector may be an edge connector, a multi-pin connector, or another suitable connector. Internally, the dock connector may be connected to a main logic board 301 (of FIG. 3) that provides control and operation of the portable media encoder.

Figure 3:
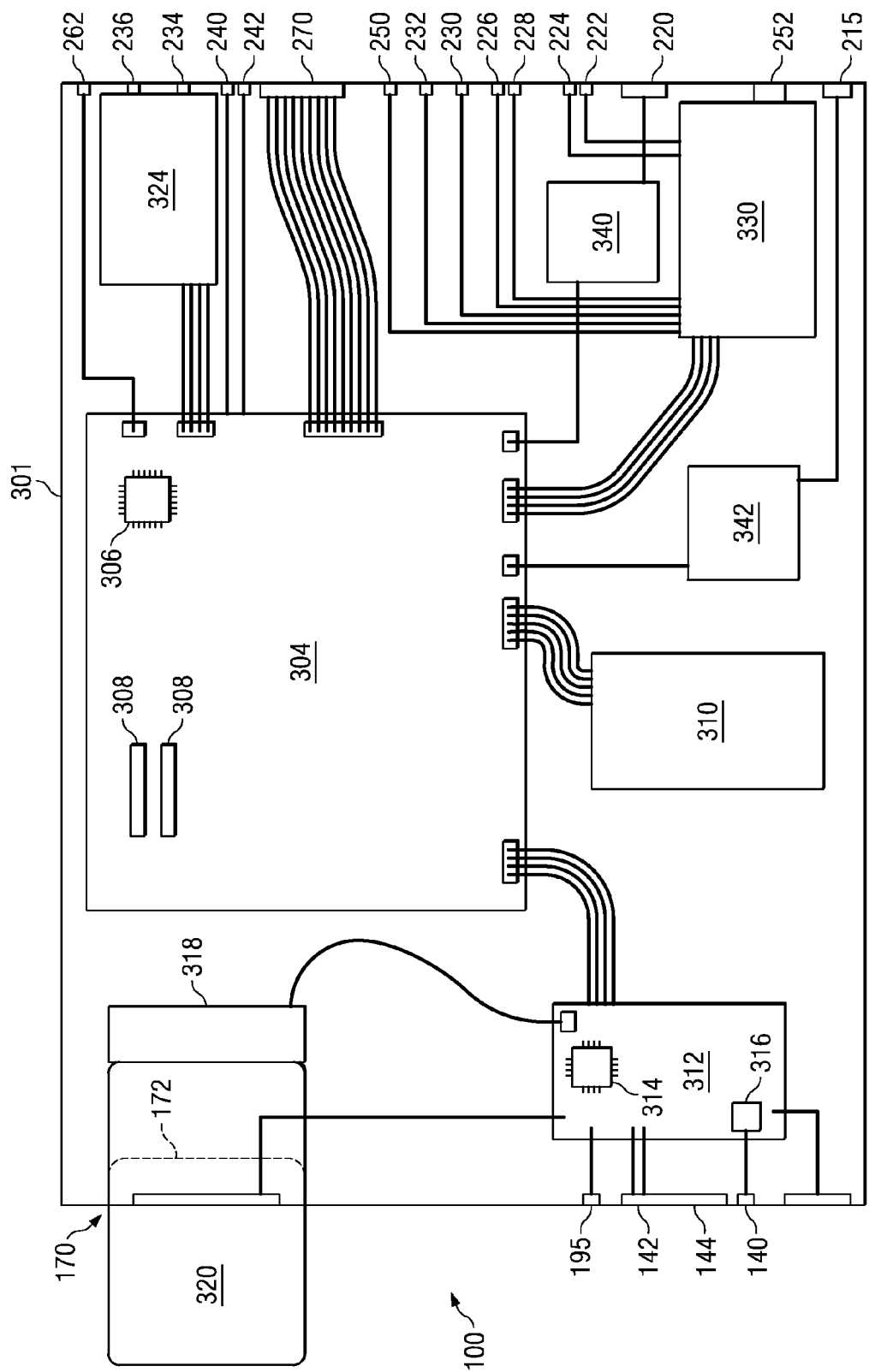
FIG. 3 is a schematic diagram of the portable media encoder of FIG. 1.

Referring now to FIG. 3, a schematic diagram of the streaming media encoder 100 of FIG. 1 is shown. FIG. 3 is meant to represent a high level component layout of only one embodiment of a portable media encoder. It is understood that the internal components may be arranged differently than shown in FIG. 3 while maintaining all the desired functionality of the portable media encoder 100. A case or housing 301 may be provided to house and protect the internal components of the portable media encoder 100. The case 301 may be made from a metal, alloy, plastic, or other material providing sufficient rigidity for mounting of the internal components in a secure fashion.

A main logic board or motherboard 304 may be provided for interconnection and control of the other components within the case 301 of the portable media encoder 100. The motherboard 304 may also serve to encode the input data stream or streams captured by the capture card 330. The motherboard 304 may handle encoding, compression, storage, transmission, and other operations for the captured input streams. These operations may be hardware or software driven, or a combination of both. In this manner, the motherboard 304 serves as an encoding processor. Some embodiments of the portable media encoder 100 may also have separate specialized processors specifically designed for capture and/or encoding of the input streams.

In some embodiments, the motherboard 304 may be a commercially available, off-the-shelf motherboard such as one suitable for use in a personal computer. The motherboard 304 may include a central processor unit (CPU) 306 and various banks of random access memory (RAM) 308. A non-volatile storage device 310 may be attached to the motherboard 304 to provide operating system and control information. In some embodiments the non-volatile storage device 310 may be a hard disk drive although in other embodiments other non-volatile storage means such as flash drives may be used. When the non-volatile storage device 310 is active, the motherboard 304 may cause the disk activity indicator 242 (of FIG. 2) to illuminate. The operating and control software for the portable media encoder 100 may be Windows XP Professional, from Microsoft Corporation of Redmond, Wash. or another Windows product. In other embodiments, the operating system may be an open source or purpose built system.

A daughter board 312 may be used to provide functionality not available on the motherboard 304 or to increase ease of assembly or manufacturing of the portable media encoder 100. In the present embodiment, the daughter board 312 includes a USB controller 314. The USB controller 314 may be adapted to provide access to one or more of the USB ports such as USB port 195 or USB port 262. In other embodiments, the USB controller 314 may be located on the motherboard 304. The daughter board 312 also provides an audio amplifier 316. The audio amplifier 316 may be configured to provide the audio output to the audio output jack 140. In some embodiments, the audio amplifier 316 provides the control for the audio level meters 142, 144. In other embodiments, a separate device on the daughter board 312 and/or motherboard 304 provides the functionality of the audio level meters 142, 144. The audio amplifier also interconnects with the volume control buttons 136, 138 on the front panel 100 for determining the output volume of the audio output jack 140.

Connected to the motherboard 304 and/or the daughter board 312 is a media adapter 318. In one embodiment, the media adapter 318 is powered and/or controlled by the USB controller 314 on the daughter board 312. There media adapter 318 serves to provide a data and power interface to the removable storage device 320. The media adapter 318 may be specific to the removable media device 320. However, by providing a different media adapter 318, additional kinds of removable storage devices 320 may be utilized by the portable media encoder 100. The removable storage device 320 may be a removable hard disk drive, a flash drive, a personal music or video player, a personal digital assistant (PDA), a cell phone, or another device capable of receiving and storing data. In the embodiment shown in FIG. 3, the portable media adapter 318 is an internal component of the portable media encoder 100. However, in other embodiments the media adapter 318 may be insertable via the media port 170 thus allowing the user to interchange media adapters to allow a plurality of different types of removable storage devices to be used with the same portable media encoder 100. In these embodiments, the interchangeable media adapters may be configured to interface with the portable media encoder 100 via an internal USB connection (not shown) or other interface.

A network adapter 324 may also interface with the motherboard 304. The network adapter 324 may be a commercially available ethernet card. In other embodiments, network connectivity may be integrated into the motherboard 304. The network adapter 324 provides the ethernet ports 234, 236. Two ethernet ports are provided in the present embodiment but the present disclosure is not meant to be so limited. In some embodiments, one ethernet port may be used for providing output from the portable media encoder 100 while the other may be used for remotely-controlling the portable media encoder. The ethernet ports 234, 236 may be 100 Mb ports, 1 Gb ports, or ports of other speeds.

A separate video capture card 330 may be utilized by the motherboard 304 to capture the audio and/or video input streams for encoding on the motherboard 304. In some embodiments, the captured input streams will be digitized prior to being sent to the motherboard 304 for encoding, compression, storage, transmission, and other operations. As can be seen from FIG. 3, the video capture card 330 interconnects with the composite video connector 222, the S-video connector 224, the left and right unbalanced audio inputs 226, 228, the left and right balanced audio inputs 230, 232, as well as the VGA input 252 and the VGA output 250. In some embodiments, the video capture card may be an Osprey 230® video capture card such as manufactured by ViewCast Corporation of Plano, Tex. In other embodiments, other video capture cards may be used or the video capture functionality may be provided by the motherboard 304 and/or an additional custom manufactured daughter board. In the present embodiment, the video capture card 330 is capable of capturing both audio and video. In other embodiments, only video may be captured, or audio capturing may be performed on a separate device within the portable media encoder 100.

The portable media encoder 100 may be powered through the AC connection 215 or the DC connection 220. When the portable media encoder 100 is powered via the AC connection 215, an AC power converter 342 receives and conditions the alternating current from the AC connector 215 and converts it to the appropriate direct or alternating current and voltage needed by the various components of the portable media encoder 100 such as the motherboard 304. Similarly, a DC power converter 340 receives power from the DC power connection 220 and converts it to the appropriate current and voltage for the internal components of the portable media encoder 100.

The motherboard 304 provides the functionality to operate the power indicator LED 240 and the activity LED indicator 242. The motherboard 304 may use information obtained from the non-volatile storage device 310, the power converters 340, 342 and/other componentry within the portable media encoder 100 in order to properly control the indicators 240, 242. The motherboard 304 may also provide an interface to the dock connector 270. The connection between the dock connector 270 and the motherboard 304 may be made by a ribbon cable or other suitable connector.

Figure 4:
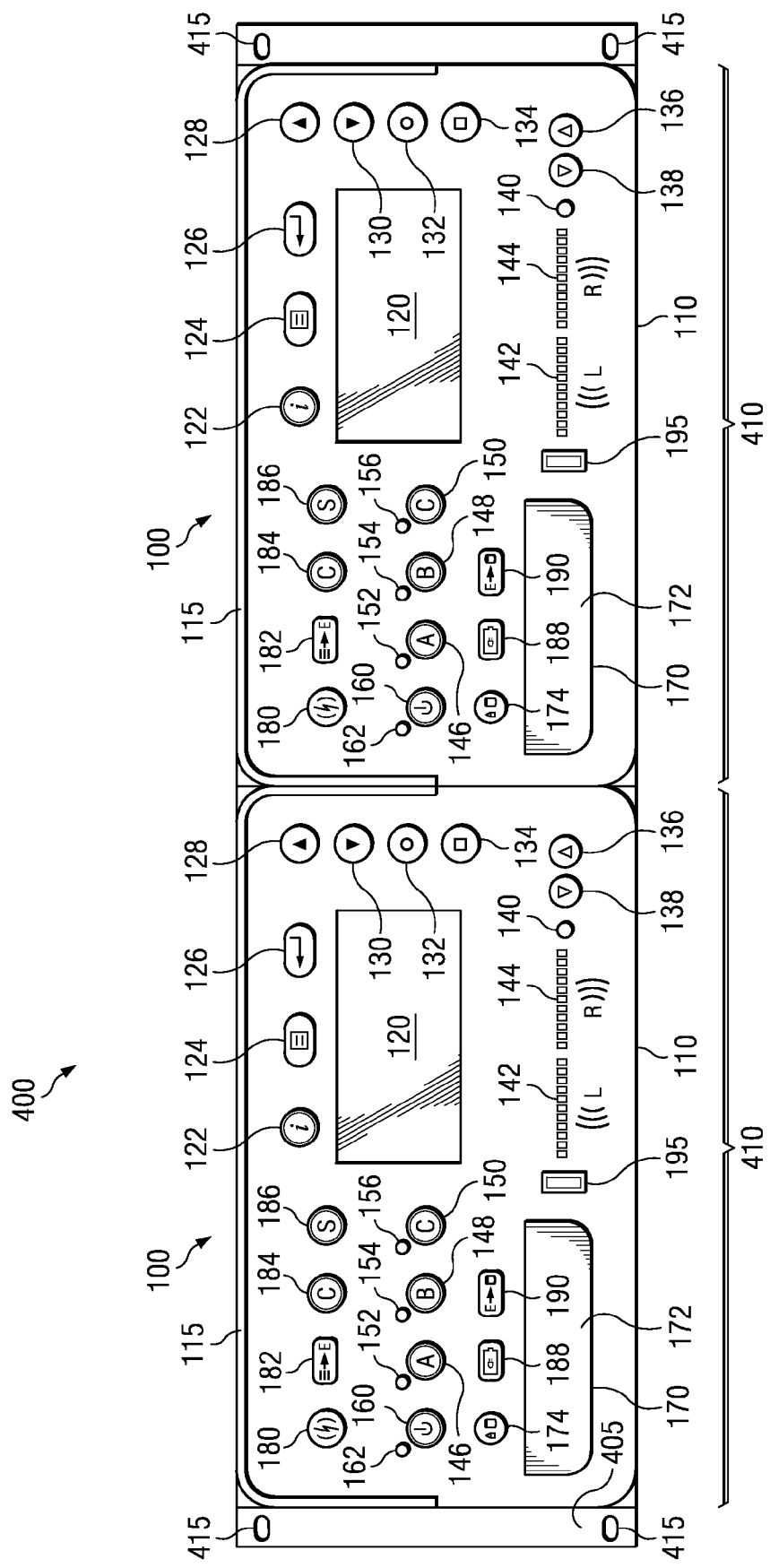
FIG. 4 is a frontal view of one embodiment of a rack mount for a portable media encoder according to aspects of the present disclosure.

Referring now to FIG. 4, a frontal view of one embodiment of a rack mount 400 for a portable media encoder 100 according to aspects of the present disclosure is shown. The rack mount 400 is designed to allow operation of one or more portable media encoders 100 in a fixed location, such as in a studio or remote-site vehicle. In the embodiment shown, two portable media encoders 100 are inserted into the rack mount 400, but in other embodiments the rack mount 400 may be configured to accept a different number of portable media encoders 100. The rack mount 400 provides a rack face 405 with two encoder mounting slots 410. The rack mount 400 is itself designed to be mounted into a rack mounting system as will be described in greater detail below. Holes 415 may be defined by the rack face 405 to receive fasteners for securely attaching the rack mount 400 into a rack mounting system. It can be seen from FIG. 4 that all of the frontal controls of the portable media encoders 100 are accessible and operational when the portable media encoders 100 are seated in the rack mount 400. It can also be seen from FIG. 4 that the handles 115 of the portable media encoders 100 are configured to fold flush with the front faces 110 of the portable media encoders 100 and the rack face 405 of the rack mount 400.

Figure 5:
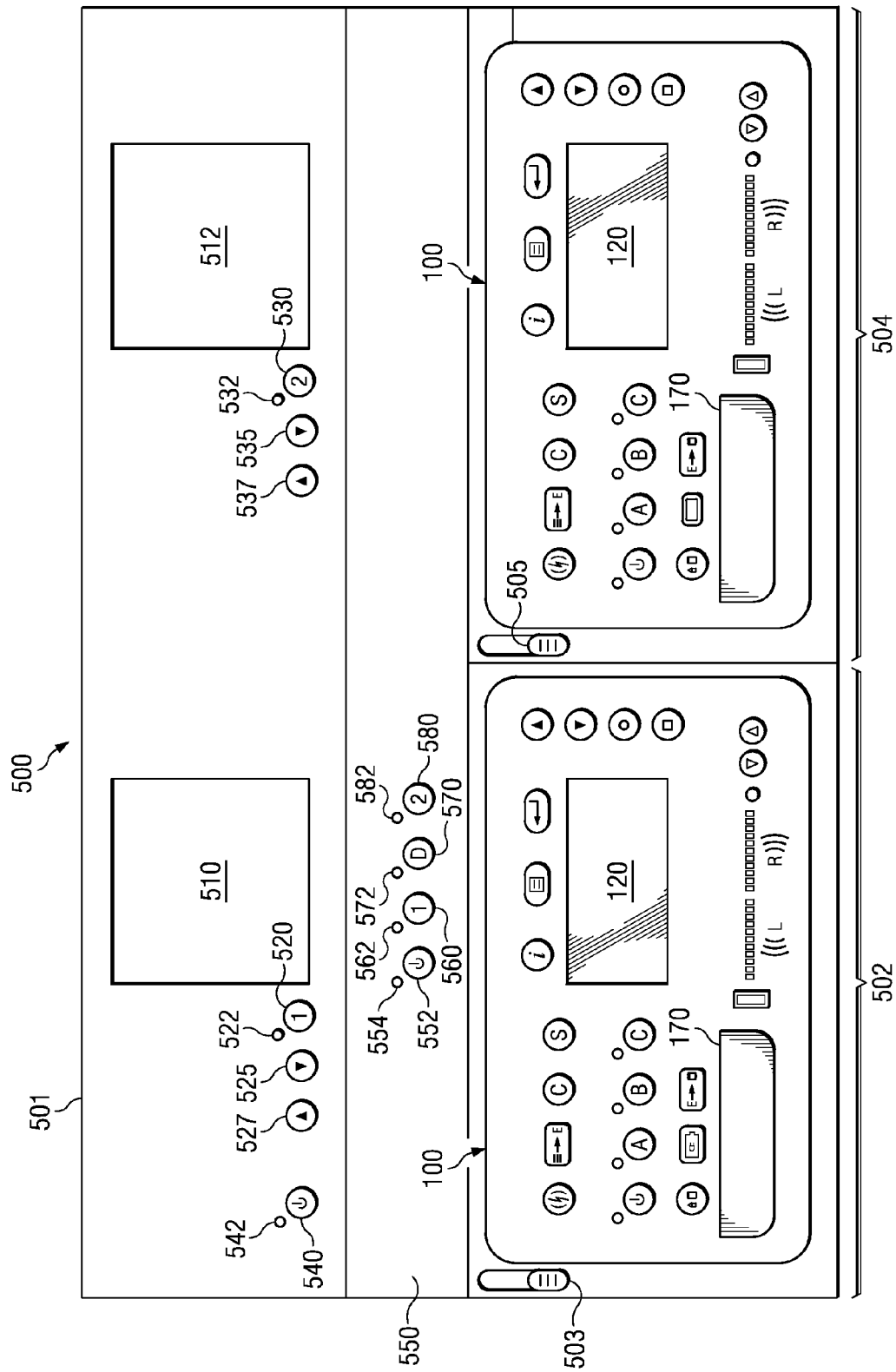
FIG. 5 is a frontal view of another embodiment of a rack mount for a portable media encoder according to aspects of the present disclosure.

Referring now to FIG. 5, a frontal view of another embodiment of a rack mount 500 for one or more portable media encoders 100, 101 according to aspects of the present disclosure is shown. The portable media encoder 101 is understood to be substantially identical to the portable media encoder 100. Similar to the rack mount 400 of FIG. 4, the rack mount 500 shown in FIG. 5 is adapted to interface with a larger rack mounting system as will be described in greater detail below. As can be seen from FIG. 5, the rack mount 500 provides additional functionality over the rack mount 400 of FIG. 4. The rack mount 500 has a front panel 501 having a portable media encoder receptacle 502 and an associated release slide 503. An additional portable media encoder receptacle 504 is also provided with a release slide 505. The portable media encoder receptacles 502, 504 are adapted to receive portable media encoders 100, 101, respectively. As with the rack mount 400, the rack mount 500 allows full use of the frontal displays and controls of the portable media encoders 100. Some embodiments of the rack mount 500 may a have locking mechanism for locking the portable media encoders in place within the receptacle 502, 504. The slides 503, 505 may be operable to release such locking mechanism for removal of the portable media encoders 100, 101 from the rack mount 500.

On the face 501 of the rack mount 500 are confidence monitors 510 and 512. The confidence monitor 510 may correspond to the portable media encoder 100 mounted in the portable media encoder receptacle 502 while the confidence monitor 512 may correspond to the portable media encoder 101 mounted in the portable media encoder receptacle 504. The confidence monitors 510, 512 serve to provide a visual confirmation that the portable media encoders 100, 101 are producing an encoded video stream. In the embodiment shown, the confidence monitor 510 may be activated by the button 520, labeled '1', and corresponding to portable media encoder receptacle 502, while the confidence monitor 512 may be activated by pressing the button 530, labeled '2', and corresponding to the portable media encoder receptacle 504. Indicator lights 522 and 532 are also provided corresponding to confidence monitors 510 and 512, respectively. The indicator lights may be LED's and may indicate to a user whether either or both of the confidence monitors 510, 512 are active. Brightness controls may also be provided through brightness control buttons 525 and 527 associated with confidence monitor 510 and brightness control buttons 535, 537 associated with confidence monitor 512. A confidence monitor power switch 540 corresponding to the power supply for both confidence monitors 510, 512 may also be provided. An indicator light 532 indicates whether power is supplied to the confidence monitors 510, 512.

An encoder control panel 550 may also be provided to allow a user to access the additional features of the rack mount 500. A master power button 552 and associated indicator light 554 may be provided. An encoder selection button 560 may be provided and is operable to activate the portable media encoder 100 located in portable media encoder receptacle 502. Similarly, an encoder selection button 580 activates the portable media encoder 101 located in the portable media encoder receptacle 504. Indicator lights 562 and 582 provide a visual indication that the respective portable media encoders 100, 101 are active. The rack enclosure 500 may provide a redundant mode whereby both of the portable media encoders 100, 101 may be utilized to encode the same audiovisual input stream. The redundant mode may be activated in the embodiment shown by pressing the redundant mode selection button 570. A redundant mode selection indicator 572 provides visual confirmation that the portable media encoders 100, 101 are operating redundantly. Substantially identical output streams may be provided from the portable media encoders 100, 101 when operating in a redundant mode. Furthermore, either of the portable media encoders 100 may be removed or may become disabled, even during operation, without affecting the output from the rack enclosure 500. The operating status of the portable media encoders 100, 101 may be ascertained by information provided by the portable media encoders themselves (e.g., information on the displays 120). As described, indication of the operating state of the portable media encoders 100 may also be provided by the confidence monitors 510, 512 and the various indicator lights appearing on the front panels 110 of the portable media encoders 100, 101.

Figure 6:
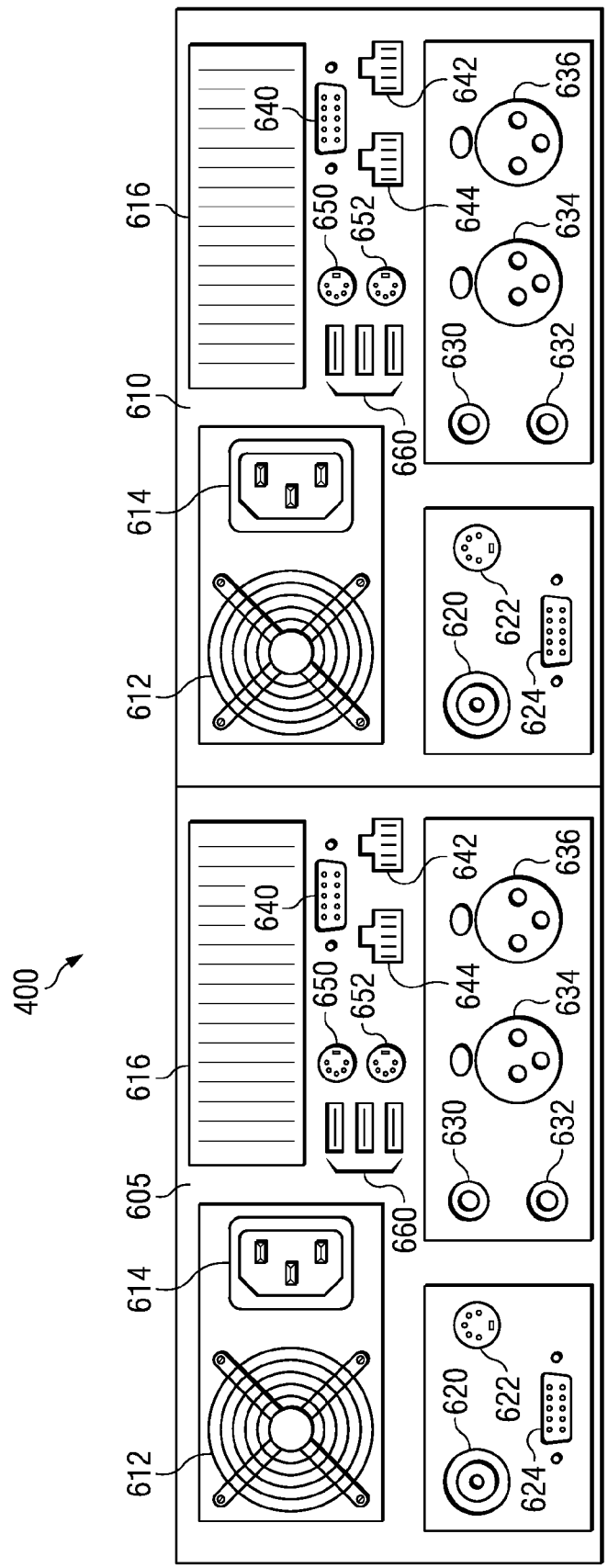
FIG. 6 is a back view of one embodiment of a rack mount for a portable media encoder according to aspects of the present disclosure.

Referring now to FIG. 6, a back view of one embodiment of the rack mount 400 for the portable media encoder 100 according to aspects of the present disclosure is shown. As can be seen from FIG. 6, the back of the rack mount 400 (as shown in FIG. 4) provides replication of all inputs and outputs on the back of the portable media encoder 100 (as shown in FIG. 1). The present embodiment shows two rear rack panels 605, 610. Each of the rear rack panels 605, 610 provides input and output replication for an individual portable media encoder. It can be seen that the rear rack panel 605 may also provide ventilation via fan 612 and ventilation grille 616. Similarly, rear rack panel 610 provides ventilation via fan 612 and ventilation grille 616. The fans 612 and the ventilation grille 616 may be particularly useful when the portable media encoder is mounted in the rack mount 400, or the rack mounting system described below, and is therefore subject to more restrictive air flow.

Like the back panel of the portable media encoders 100, 101 it can be seen that the rear rack panels 605, 610 of the rack enclosure 400 provide both composite video inputs 620, VGA video inputs 624 and S-video inputs 622. Similarly, right and left unbalanced audio inputs are provided, 630 and 632, respectively, as well as left and right balanced audio inputs 634, 636, respectively. As with the portable media encoders 100, 101, the rear rack panels 605, 610 provide unbalanced audio input by RCA-style connectors. Balanced audio input is provided by XLR-type connectors. Outputs may be provided on ethernet connectors 642, 644 and on a VGA connection 640. Keyboard connections are provided via PS2 ports 650 and mouse connections are provided via PS2 ports 652. USB ports 660 may also be provided on the rear rack panels 605, 610 to provide input/output functionality as well as downloading and upgrade functionality to the portable media encoders 100, 101.

Figure 7:
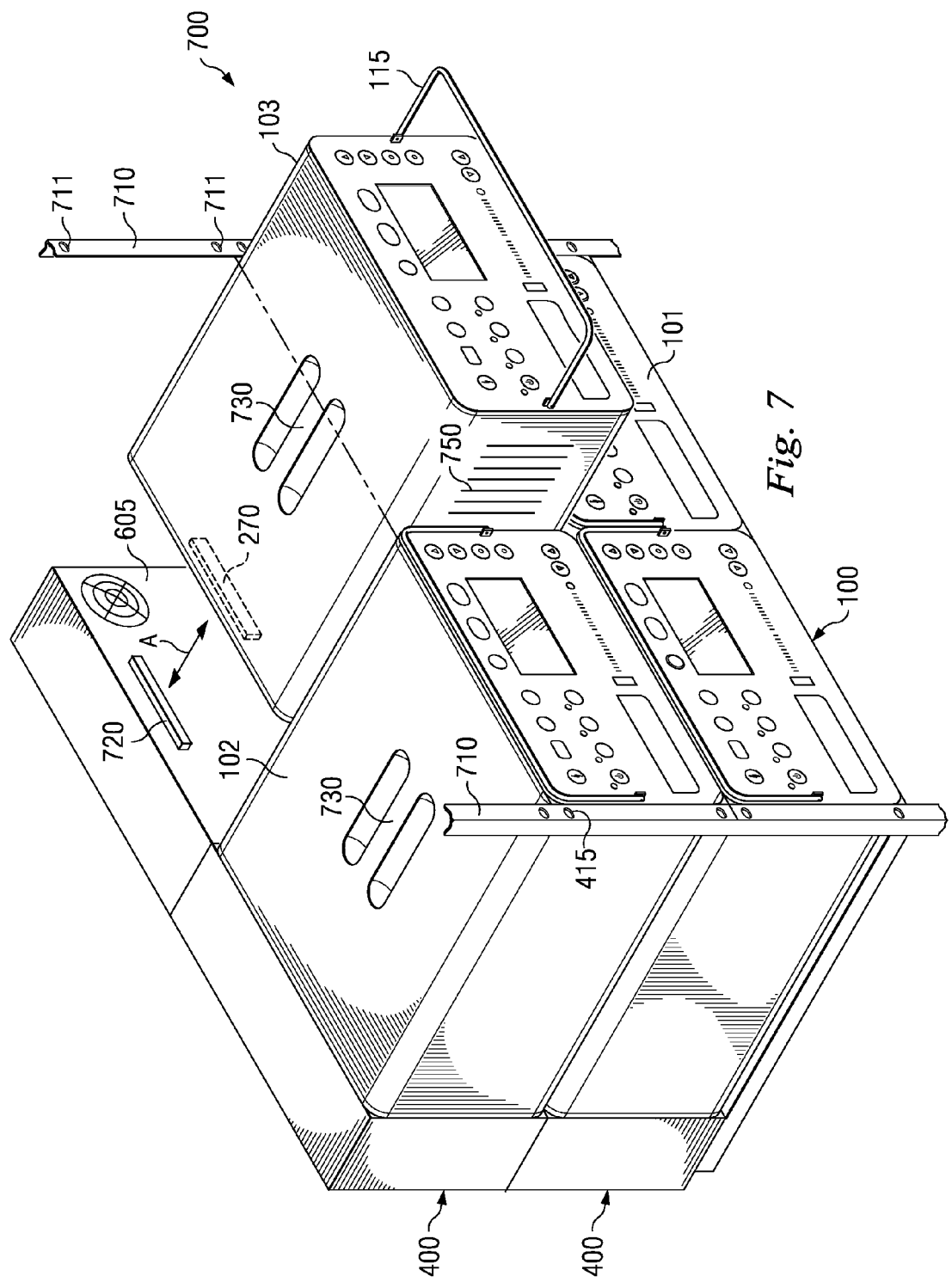
FIG. 7 is a perspective view of one embodiment of a rack mounting system for portable media encoders according to aspects of the present disclosure.

Referring now to FIG. 7, a perspective view of one embodiment of a rack mounting system 700 for mounting portable media encoders 100, 101, 102, 103 according to aspects of the present disclosure is shown. In the present embodiment, the portable media encoders 100, 101, 102, 103 are substantially identical. As can be seen in FIG. 7, the rack mounting system 700 may be designed to accommodate multiple rack mounts 400. In other embodiments, the rack mounting system 700 may be configured to accommodate the rack mount 500 in addition to, or instead of, the rack mount 400, as shown. One or more rack mounting supports 710 may be provided into which the rack mounts 400 may be secured. Holes 711 may be defined in the rack mounting support 710 corresponding to the holes defined in the rack mounts 415. The holes 711 may be used to receive fasteners, such as nuts and bolts or screws, for keeping the portable media encoders 100, 101, 102,103 and/or the rack mounts 400 securely mounted in the rack mounting system 700.

From the view shown in FIG. 7, it may be seen that the docking connector 720 is provided for interfacing with the docking connector 270 on the rear of the portable media encoder 103. Additional docking connectors (not shown) are provided for each of the portable media encoders 101, 102, 103 in the rack mounting system 700. The docking connector 720 (and those not shown) provides a means for the input and output ports on the rear of the rack mount 400 to be provided internally to the components inside of the portable media encoder 103. In some embodiments, the portable media encoder 100 may be coupled to the rack mounting enclosure 400 by inserting the portable media encoder 100 in the direction shown by arrow A until the docking connectors 720 and 270 are securely interfitted. Insertion and removal of the portable media encoder 100 may be facilitated by handle 115 (shown here in the down, or extended, position) as well as an integrated handle 730 on the portable media encoder 100. It can also be seen from this view that ventilation may be provided on the portable media encoder 100 itself by the ventilation grille 750.

Figure 8:
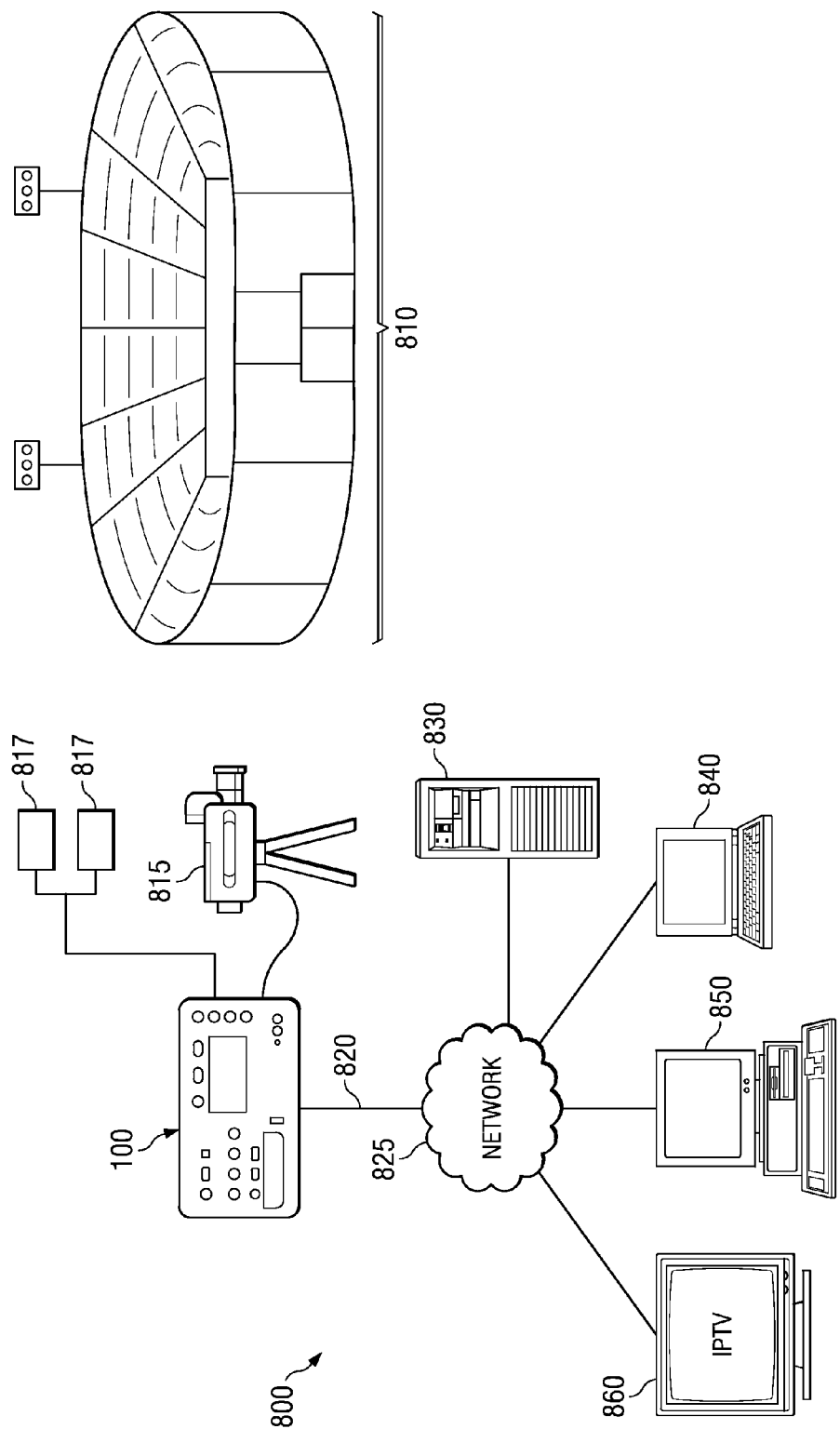
FIG. 8 is a view of an operating environment for a portable media encoder according to aspects of the present disclosure.

Referring now to FIG. 8, a view of an operating environment 800 for a portable media encoder according to aspects of the present disclosure is shown. An event location 810 is shown which is meant to represent one of many different possible occasions and/or locations that may provide audiovisual information that a user of the portable media encoder 100 may wish to capture and encode. The event location 810 may include, but is not limited to, a sporting event, a presentation, a ceremony, a recital, and/or other events typically video taped or recorded. In some embodiments, the event location 810 may simply be an area over which surveillance is desired, such as a retail location, a high security area, or even a private home. A video source 815 may be provided at or near the event location 810 and may be adapted to provide an initial capture or rendering of the event location 810. In some embodiments, the video source 815 may provide an analog signal as an output corresponding to the information gathered and recorded at the event location 810. As has been described, the portable media encoder 100 provides a plurality of analog inputs suitable for receiving the analog output from the video source 815. The video source 815 may provide both audio and visual recorded information to the portable media encoder 100. In other embodiments, audio feeds may be provided by remote microphones 817. The portable media encoder 100 receives the analog audio and video input and converts the analog input into a digital format suitable for streaming on a digital output. Additionally, the digitally encoded audio or video may be archived on a local storage device associated with the portable media encoder 100.

The digitized output 820 from the portable media encoder 100 may be distributed over a network 825. The network 825 may be a local area network, a wide area network, or a distributed computer network such as the Internet. In one embodiment, the portable media encoder 100 provides a streaming audio/video source that may be provided directly to one or more of a plurality of recipients. These recipients may include a user with a portable personal computer 840, a desktop computer 850, or another appliance capable of receiving streaming media over the Internet, such as the Internet protocol television set 860. Thus, the portable media encoder 100 may be used at an event location 810 to provide live coverage to the plurality of users 840, 850, and 860. In another embodiment, the portable media encoder 100 may provide the digitized audio and video information to a remote server 830. The feed to the remote server 830 may be in addition to, or instead of, the feed directly to the users 840, 850, and 860. The remote server 830 may provide a device or location for archiving the output of the portable media encoder 100 for later retrieval. In this manner, the users 840, 850, and 860 may be able to retrieve the streamed event information from the remote server 830 after the event has ended.

Figure 9:
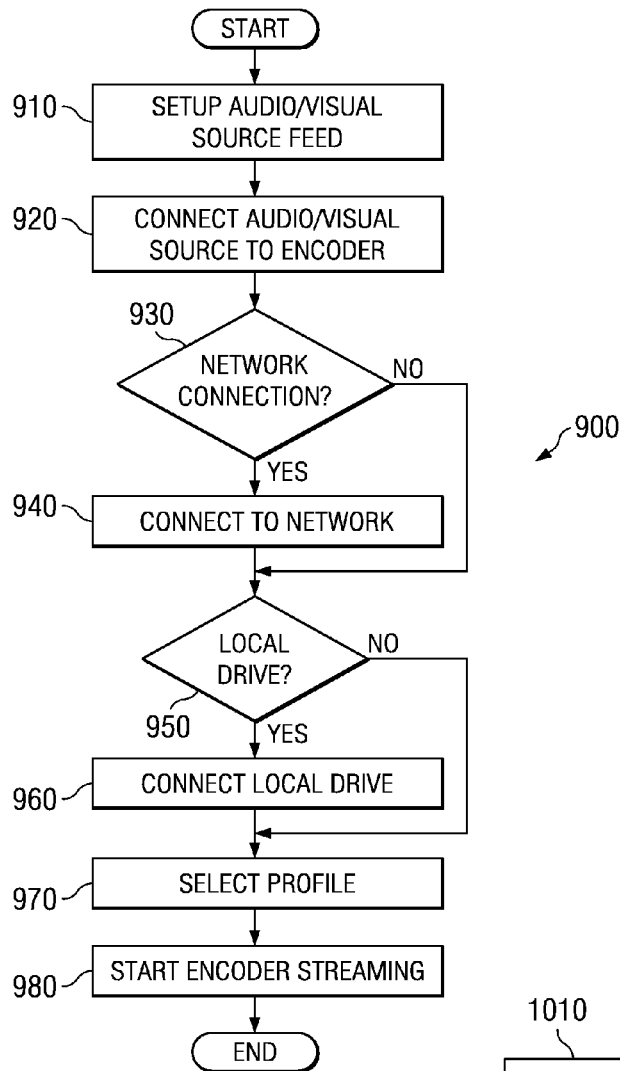
FIG. 9 is a flow diagram corresponding to a method of operation of a portable media encoder according to aspects of the present disclosure.

Referring now to FIG. 9, a flow diagram 900 corresponding to a method of operation of the portable media encoder 100 according to aspects of the present disclosure is shown. The portable media encoder 100 disclosed herein is designed, in one aspect, to provide ease of operation to the user. Through interaction with the portable media encoder 100 via the front panel 105, a relatively inexperienced user may be able to use the portable media encoder 100 to provide live streaming coverage of an event with little prior knowledge of the portable media encoder 100. The flow diagram 900 represents one possible series of steps that a user may employ to operate the portable media encoder 100. Beginning at step 910, the user will set up the audiovisual source feed. This may include providing a traditional analog video camera capable of providing analog outputs to the portable media encoder 100. At step 920, when the audio/video source feed is operational, the user will connect the audiovisual source to the encoder. This may be accomplished via the input connections provided at the back of the portable media encoder 100 or at the back of one of the various rack mounts described herein. At step 930, if a network connection is available to the portable media encoder, the user will connect to the network at step 940. If no network connection is available at step 930, if a local drive is available at step 950, the user will connect the local drive to the portable media encoder at step 960. As described, the local drive may be connected to the portable media encoder via a USB interface or via the media port 170. As can be seen from the flow diagram 900, in some embodiments, the user may connect to the network at step 940 in addition to connecting a local drive at step 960. When the portable media encoder 100 has been properly connected to the network and/or local drive, the user selects a profile at step 970. The selected profile may include all of the necessary parameters to begin the streaming process from the portable media encoder 100. These parameters may include, but are not limited to, the resolution of the encoded data stream, the format of the data, the speed of the network being used, and the level of compression used on the digitized data stream. In other embodiments, as will be described, the user can manually select one or more profile parameters. Once the user has selected a profile at step 970, or manually provided the necessary parameters to the portable media encoder, the user may start the streaming process at step 980.

Figure 10:
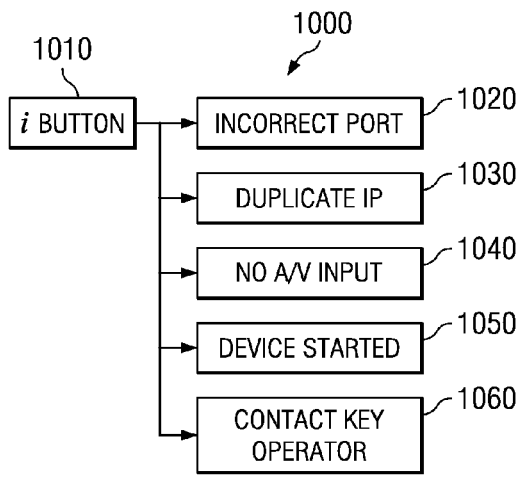
FIG. 10 is a graphical view of one embodiment of a menu system associated with an information button on a portable media encoder according to aspects of the present disclosure.

Referring now to FIG. 10, a graphical view 1000 of one embodiment of a menu associated with the information button 122 of the portable media encoder 100 according to aspects of the present disclosure is shown. The context sensitive information button 122 may be provided on the face 105 of the portable media encoder 100. The information button 122 may be context sensitive, such that when pressed, the portable media encoder 100 may respond differently depending upon the operating state of the portable media encoder 100. As can be seen in FIG. 10, the information button 122 may be used to obtain operational information about the portable media encoder 100 whenever the portable media encoder 100 is in an alarm state. At step 1010, the user presses the information button 122. Depending upon the nature of the alarm generating event within the portable media encoder 100, the portable media encoder 100 may respond by displaying on the display screen 120 a message indicating that an incorrect port has been specified, as shown at step 1020. In other cases, a duplicate Internet protocol address may have been specified. This information may be displayed at step 1030. If no audiovisual input is provided, the portable media encoder 100 may display this information at step 1040. In the event that a condition exists on the portable media encoder such that a typical user cannot address, in response to the user pressing the information button 122, at step 1010 the portable media encoder 100 will display a message to contact a key operator at step 1060. The key operator may be a technician or highly trained operator capable of addressing hardware and/or software failures of the portable media encoder 100. The portable media encoder 100 may also be capable of providing a response to a user pressing the information button 122 at step 1010 when not in an alarm state. In such case, as at step 1050, the portable media encoder 100 simply displays a message indicating that the device has been started or is operating nominally.

Figure 11:
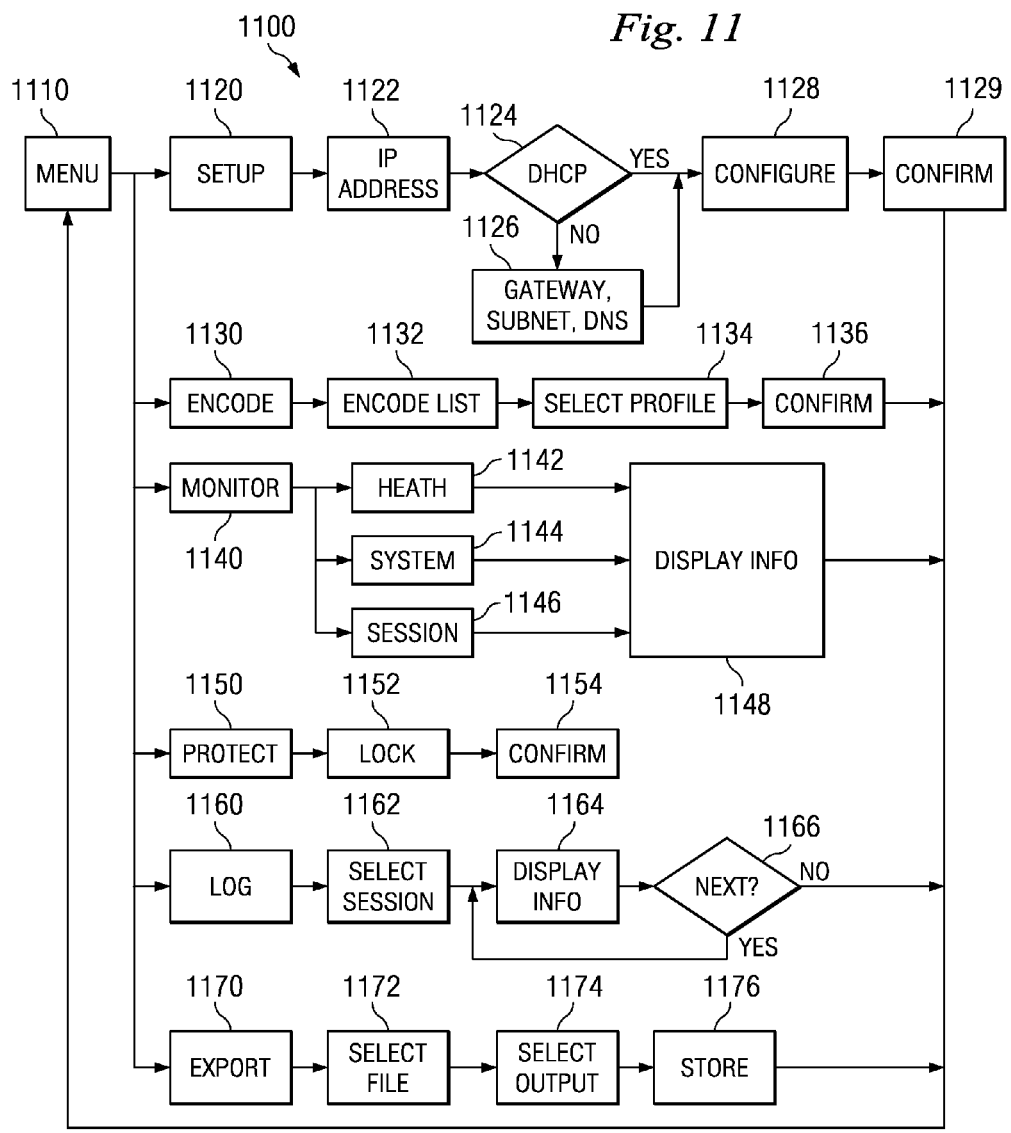
FIG. 11 is a graphical view of one embodiment of a menu system associated with a menu button on a portable media encoder according to aspects of the present disclosure.

Referring now to FIG. 11, a graphical view of one embodiment of a menu system 1100 associated with the menu button 124 on the portable media encoder 100 according to aspects of the present disclosure is shown. Referring also back to FIG. 1, a series of buttons have been provided on the face 110 of the portable media encoder 100 for interacting with a menuing system provided by the portable media encoder 100. The buttons designed for interaction with the menuing system may include the menu button 124, the enter button 126, the up selection button 128, the down selection button 130, the record button 132 and the stop button 134.

The flow diagram 1100 of FIG. 11 illustrates one embodiment of a possible control flow of a menu system suitable for use with the portable media encoder 100. A user may gain access to the menu system by pressing the menu button 124 at step 1110, as shown in the flow diagram 1100. When the menu button 124 has been pressed at step 1110, the portable media encoder 100 may display a series of choices on the display screen 120. The series of choices may be displayed one at a time, with the user required to use the up selection button 128 and the down selection button 130 to view each of the possible choices. In other embodiments, multiple selections may appear at the same time with one of the selections being highlighted and the highlighted selection being changeable by the up and down selection buttons 128, 130. The options displayed may include a set up option at step 1120, an encode option at step 1130, a monitor option at step 1140, a protect option at step 1150, a log option at step 1160, and an export option at step 1170. When the appropriate option has been selected by the user, the enter button 126 may be used to provide confirmation of the selection.

In the event that the user chooses the set up option at step 1120, a series of choices may then be presented to the user via the display screen 120 allowing for set up and configuration of the network parameters used by the portable media encoder 100. Following the selection of the set up option at step 1120, at step 1122 the user may be asked to provide an Internet protocol (IP) address of a host system that will be receiving the streaming output. Such a host system may be the remote server 830 of FIG. 8, for example. Following entry of the IP address at step 1122, the host may provide configuration information via dynamic host configuration protocol (DHCP). The determination as to whether the host provides dynamic host configuration protocol is made at step 1124. This may be done automatically by the portable media encoder 100. If the host does not provide DHCP, the user may be asked to provide additional configuration information regarding the network at step 1126. Such additional information may include the gateway, the subnet, the domain name server, and other information. Following manual entry of network parameters at step 1126, or following having such information provided automatically via DHCP, the user may confirm the provided configuration information at step 1129. As can be seen from FIG. 11, following confirmation of the provided set up information at step 1129, the menu system returns to step 1110 such that the user may continue to interact with the portable media encoder, possibly by pressing the menu button again at step 1110.

If a user of the portable media encoder 100 interacts with the portable media encoder 100 to select the encode option at step 1130, the portable media encoder 100 may respond by providing an encode list at step 1132. The encode list may correspond to a number of encoding types or profiles that are preset and available for selection when operating the portable media encoder 100. At step 1134 the user interacts with the menu system via the arrow buttons 128, 130, as previously described, to select the appropriate encoding profile. The profile may include source type, output type, frame rate, resolution, and other parameters. At step 1136 the selection is confirmed. Confirmation may be via pressing the enter button 126, for example.

If a user of the portable media encoder selects the monitor option at step 1140, a sub-menu may be presented by the portable media encoder 100. The sub-menu may provide additional choices such as health information at step 1142, system information at step 1144, and session information at step 1146. Each of these selections will offer additional information corresponding to the chosen selection. For example, if the user selects health information at step 1142, at step 1148 the encoder will provide information corresponding to the health of the encoder system. Such health information may include central processing unit utilization rate, memory capacity, hard drive capacity, and other information. If system information is selected at step 1144, information may be provided such as the IP address of one or more network adapters in the portable media encoder and/or information corresponding to the connected host. If session information is selected at step 1146, information may be provided corresponding to a current encoding session such as the IP address being used, the current port, the number of viewers of the session, the number of lost data packets, and the bandwidth or bit rate of the session.

If a user selects the protect option at step 1150, the display 120 of the portable media encoder 100 may display that a locking option is being provided by the media encoder. The locking option may allow the front control panel to be locked out from further purposeful or inadvertent changes by the user or others. A confirmation step may be required at step 1154. In some embodiments, the portable media encoder 100 may be unlocked by a predetermined series of button presses on the front panel 110. In other embodiments, the device may be unlocked by moving the lockout switch 211 located on the rear panel 205 of the portable media encoder 100 as shown in FIG. 2.

A user may select the log option at step 1160, which may provide detailed logging information corresponding to the current or previous encoding sessions. The user may be presented with a list of the current and/or previous encoding sessions and may be required to select which session's logging information is desired at step 1162. The logged information may then be displayed at step 1164. Such logged information may include, but is not limited to, the time and date of the selected entry, the file name of the selected entry, the file size, and the success or failure of the session. At step 1166 the user may be provided with the option of viewing the logged information for the next logged session in the provided list.

At step 1170, a user may choose to export one or more stored encoding sessions. A stored encoding session may include the digitized version of the information captured by the input ports on the rear panel 205 of the portable media encoder 100. The encoding session may have been stored internally within the portable media encoder, on an internal hard disk drive, for example, or may have been stored on an attached external storage device. At step 1172, a user interacts with the menu system to select the appropriate file for exporting. At step 1174, the user selects the appropriate output device to receive the exported encoding session. Such an output device may include an attached memory or storage device which may operate through a USB port, such as USB port 195 or USB port 262, or through the media port 170 of the portable media encoder 100. At step 1176, the user selects the option to store, thereby confirming the choice. The portable media encoder 100 may then proceed to export the selected file to the selected storage device.

Figure 12:
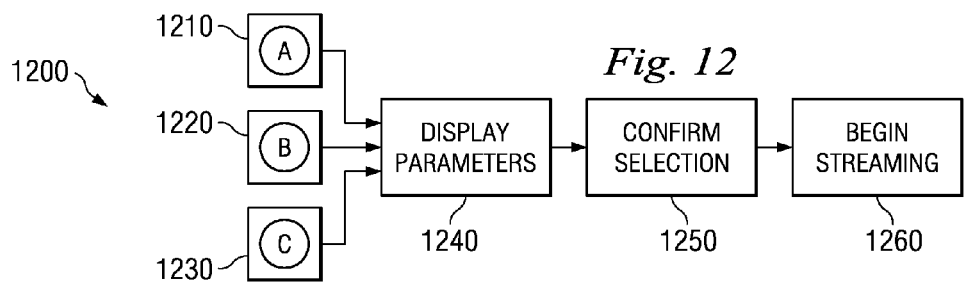
FIG. 12 is a graphical view of one embodiment of a menu system associated with a set of preprogrammed buttons on a portable media encoder according to aspects of the present disclosure.

Referring now to FIG. 12, a graphical view of one embodiment of a menu system 1200 associated with a set of preprogrammed startup buttons on a portable media encoder according to aspects of the present disclosure is shown. This menu system 1200 may be associated with the preprogrammed startup buttons 146, 148, and 150 as shown on the face 110 of the portable media encoder 100 of FIG. 1. In some embodiments of the present disclosure, the user may be able to quickly begin streaming of an event using the portable media encoder 100 by a few simple operations via the buttons provided on the face 110 of the portable media encoder 100. The user may select the 'A' option at step 1210, which corresponds to pressing the 'A' button 146. Similarly, the 'B' option at step 1220 corresponds to the 'B' button 148, and the 'C' option at step 1230 corresponds to the 'C' button 150. In the event that a user selects option A, B or C corresponding to step 1210, 1220 or 1230, respectively, the portable media encoder may respond by displaying on the display 120 a series of parameters associated with the chosen selection. This occurs at step 1240 as shown in FIG. 12. In the embodiment shown, the user may confirm the selection at step 1250. Since all of the parameters may have been pre-established and associated with one of the buttons 146, 148, or 150, no additional information may be needed. At step 1260, the encoder 100 begins streaming based upon the parameters chosen by the user as associated with the buttons 146, 148, or 150. The parameters associated with these buttons may be provided and/or programmed into the portable media encoder 100 using the mouse and keyboard ports 248, 246, respectively, on the rear panel of the encoder 100, as described. In other embodiments, parameters and options may be provided via a USB key drive interface through one of the USB ports 195, 262 of the portable media encoder 100. In yet another embodiment, the options associated with the quick start buttons 146, 148, and 150 may be provided over the network through the network interface ports 234 and 236 as shown in FIG. 2.

It will be appreciated by those skilled in the art having the benefit of this disclosure that this invention provides portable media encoder. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that he following claims be interpreted to embrace all such further modifications, changes, rearrangements, substitutions, alternatives, design choices, and embodiments.

What is claimed is:

1. A portable media encoder comprising:
   a video input port configured to receive a real time video input from a video capture source;
   an audio input port configured to receive an audio input from an audio source;
   a digital output port for providing a digital output real time stream corresponding to the received video input and audio input;
   an encoding processor that converts the video input and the audio input into a streamable real time digital output format for transmitting through the digital output port;
   a housing including front and rear panels enclosing the encoding processor and providing at least one access panel providing user access to the video input port, the audio input port, and the digital output port, the housing having a size and configuration enabling a single individual to hand carry the encoder;
   a display screen mounted in the front panel and communicatively coupled to the encoding processor and operable to display confirmation of encoding operations therefrom;
   a set of control buttons mounted on the front panel and communicatively coupled to the encoding processor and operable to provide preselected encoding parameters to thereto, the control buttons including a context-sensitive information button operable to provide operational information corresponding the current operational state of the portable media encoder to a user via the display screen; and
   a capture card connected to the video input port and the audio input port, the capture card digitizing the input from the audio source and the input from the video source for encoding by the encoding processor in real time.

2. The portable media encoder of claim 1 further comprising a plurality of docking connectors configured to mate with the docking connectors of each of a plurality of portable media encoders for selectively communicatively coupling with the docking connector of each of the plurality of the portable media encoders.

3. The portable media encoder of claim 1, wherein the set of control buttons includes at least one preprogrammed button operable to actuate a predetermined encoding profile and operable to start encoding of the video input and the audio input in accordance with the profile.

4. The portable media encoder of claim 1, further comprising a media port accessible via the housing for selectively communicatively coupling a portable storage device to the portable media encoder, the media port operable to power the portable storage device when coupled thereto.

5. The portable media encoder of claim 4, wherein the media port is adaptable to communicatively couple to a plurality of different portable storage device types via a set of interchangeable adapters.

6. The portable media encoder of claim 1, wherein the video input port and the audio input port are analog input ports.

7. The portable media encoder of claim 1, wherein the digital output port is an ethernet connection.

8. The portable media encoder of claim 1, further comprising a universal serial bus (USB) port operable to receive encoder programming parameters.

9. The portable media encoder of claim 1, further comprising an audio output jack configured to provide output corresponding to the audio portion of the streamable digital output.

10. A portable media encoder comprising:
    a rigid housing, having front and rear panels with a set of audiovisual input ports on the rear access panel and at least one digital output port on the rear access panel;

a display screen mounted in the front panel and communicatively coupled to the encoding processor and operable to receive confirmation of encoding operations therefrom;

a plurality of discrete preprogrammed buttons, each button enabling a user to start an encoding process with button specific encoding configuration information stored in the portable media encoder and wherein the specific encoding configuration information includes one or more of source type, output type, frame rate and resolution; and a main logic board securely affixed within the housing and communicatively coupled to the preprogrammed buttons and the digital output port; and wherein the main logic board receives a user command via the set of preprogrammed buttons, encodes the digitized output corresponding to operational parameters operable in response to the user command to produce a streamable, real time digital output, and provides the streamable digital output to the digital output port.

11. The portable media encoder of claim 10 further comprising a capture card communicatively coupled to the main logic board and the audiovisual input ports, the capture card digitalizing input received from the audiovisual input ports and providing a corresponding digitized real time output to the main logic board.

12. The portable media encoder of claim 10, further comprising a media port, the media port communicatively coupled to the main logic board for receiving the digitized output from the main logic board.

13. The portable media encoder of claim 11, further comprising an ethernet port on the rear access panel and communicatively coupled to the main logic board, the main logic board adapted to receive operational parameters via the ethernet port.

14. The portable media encoder of claim 10 wherein a plurality of discrete preprogrammed buttons includes a menu button operable to provide user access to a series of menus services provided by the portable media encoder, whereby menu selections are displayed on the display.

15. The portable media encoder of claim 14 wherein the plurality of discrete preprogrammed buttons includes one or more selection buttons operable to enable a user to view menu choices displayed on the display.

16. The portable media encoder of claim 10, further comprising a universal serial bus (USB) port accessible via the housing and communicatively coupled to the main logic board, the main logic board adapted to receive operational parameters via the USB port.

17. The portable media encoder of claim 10 further comprising a lockout switch mounted in the rear panel, the lockout switch operative in a locked position to prevent changes to the operating state of the portable media encoder the controls on the front panel while the portable media encoder is operating.

18. A portable media encoder comprising:

input ports configured to receive a real time video input from a video capture source and an audio input from an audio source;

a digital output port for providing a digital output real time stream corresponding to the received video input and audio input;

an encoding processor that converts the video input and the audio input into a streamable real time digital output format for transmitting through the digital output port;

a capture card connected to the input ports, the capture card digitizing the input from the audio source and the input from the video source for encoding by the encoding processor in real time;

a housing including front and rear panels enclosing the encoding processor and providing at least one access panel providing user access to the video input port, the audio input port, and the digital output port;

a display screen mounted in the front panel and communicatively coupled to the encoding processor and operable to display confirmation of encoding operations therefrom;

a set of control buttons communicatively coupled to the encoding processor and operable to provide preselected encoding parameters to thereto, the control buttons including a context-sensitive information button operable to provide operational information corresponding the current operational state of the portable media encoder to a user via the display screen; and a media port, the media port communicatively coupled to encoding processor for receiving the digitized output from the encoding processor.

19. The portable media encoder of claim 18, further comprising a universal serial bus (USB) port accessible via the housing and communicatively coupled to the encoding processor, the encoding processor adapted to receive operational parameters via the USB port.

20. The portable media encoder of claim 18, wherein the set of control buttons includes at least one preprogrammed button operable to actuate a predetermined encoding profile and operable to start encoding of the video input and the audio input in accordance with the profile.

\* \* \* \* \*